United States Patent [19]

Vig

[11] Patent Number: 4,899,117

[45] Date of Patent: Feb. 6, 1990

[54] HIGH ACCURACY FREQUENCY STANDARD AND CLOCK SYSTEM

[75] Inventor: John R. Vig, Colts Neck, N.Y.

[73] Assignee: The United States of America as represented by the Secretary of the Army, Washington, D.C.

[21] Appl. No.: 138,790

[22] Filed: Dec. 24, 1987

[51] Int. Cl.[4] .................................................. H03L 7/26
[52] U.S. Cl. .......................................... 331/3; 331/44; 331/47; 331/176; 368/56; 368/202
[58] Field of Search ................ 331/3, 44, 94.1, 177 R, 331/177 V, 47, 54, 55, 176; 368/46, 52, 56, 59, 155, 156, 200, 202

[56] References Cited

U.S. PATENT DOCUMENTS

| | | | |
|---|---|---|---|
| 4,303,893 | 12/1981 | Goldberg | 331/3 X |
| 4,476,445 | 10/1984 | Riley, Jr. | 331/3 |
| 4,582,434 | 4/1986 | Plangger et al. | 368/46 |
| 4,633,422 | 12/1986 | Brauer | 368/200 X |

*Primary Examiner*—Siegfried H. Grimm
*Attorney, Agent, or Firm*—Michael Zelenka; Sheldon Kanars

[57] ABSTRACT

A high accuracy atomic frequency standard and clock which utilizes a microcomputer. The microcomputer compensates for aging and temperature variations in the atomic standard and its slave crystal oscillator and generates an error signal which is used to either correct the frequency of the slave crystal oscillator or to adjust the number of clock pulses per unit time interval. No C-field adjustment is employed.

2 Claims, 1 Drawing Sheet

HIGH ACCURACY FREQUENCY STANDARD AND CLOCK SYSTEM

The invention described herein may be manufactured, used, and licensed by or for the Government for governmental purposes without the payment of any royalties thereon or therefor.

TECHNICAL FIELD

This invention relates generally to high accuracy frequency standards and clock systems and more particularly to microcomputer controlled frequency standards and clock systems.

BACKGROUND OF THE INVENTION

There are two major categories of high accuracy frequency standards: (a) atomic frequency standards, and (b) stand-alone crystal oscillators. In general, the higher the inherent accuracy of any frequency source, the higher the cost, size and weight. The currently used precision frequency sources in descending order of accuracy are: (a) cesium frequency standards, (b) rubidium frequency standards, (c) oven controlled crystal oscillators and (d) temperature compensated crystal oscillators. The cesium and rubidium standards are termed "atomic frequency standards". Oven controlled crystal oscillators and temperature compensated crystal oscillators will be termed "stand-alone crystal oscillators" in this application.

Most atomic frequency standards incorporate a slave crystal oscillator. The resulting combination is designed to take advantage of the long term stability of the atomic resonator and the short term stability of the slave crystal oscillator. The output frequency of the combination is taken from the slave crystal oscillator (often via a frequency synthesizer).

The frequencies of frequency standards change due to the influences of temperature, shock, vibration, or ionizing radiation. Furthermore, the frequencies of rubidium frequency standards, oven controlled crystal oscillators and temperature compensated crystal oscillators also change with time, i.e. they age. In all currently-available frequency standards, some means is provided for adjusting the frequency of the standard in order to eliminate undesirable frequency offsets. For example, in a rubidium standard, a magnetic field, termed the "C-field" may be adjusted in order to cause a slight change in the rubidium frequency standard output frequency. In stand-alone crystal oscillators, a varactor or other control circuitry is usually incorporated to provide output frequency adjustment.

An external reference frequency standard is needed to calibrate secondary frequency standards such as a rubidium standard or stand-alone crystal oscillators. Common sources of external reference frequency standards are: (a) a portable cesium standard, (b) a Loran-C receiver, and (c) a Global Positioning System (GPS) receiver. During calibration, the frequency of the frequency standard is adjusted to that of one of the above-mentioned external frequency references, i.e. the frequency source is syntonized to the external frequency reference. U.S. Pat. No. 4,476,445, entitled "Method and Apparatus for Rapid and Accurate Frequency Syntonization of an Atomic Clock" issued to Riley discloses a method for syntonizing the frequencies of a laboratory frequency standard with an external reference standard.

Many of the prior art methods for calibrating atomic frequency standards (i.e. syntonizing the frequencies of a frequency standard with an external reference standard) involve adjustment of the magnetic field termed the "C-field." For example, the aforementioned U.S. patent provides for an automatic C-field adjustment. The requirement to periodically adjust the C-field of a laboratory atomic frequency standard means added complexity and cost and provides a source of potential instability for the laboratory atomic frequency standard. Moreover, in rubidium frequency standards, the available C-field adjustment range limits the useful life of the unit. For example, in one of the most popular rubidium frequency standards currently on the market, the manufacturer provides a C-field adjustment range equivalent to $+1.5\times10^{-9}$. The aging rate of the standard is specified as $2\times10^{-10}$ per year. Consequently, at the specified aging rate, the limited C-field adjustment range limits the useful life of this rubidium frequency standard to $1.5\times10^{-9}/2\times10^{-10}=7.5$ years.

Consequently, those concerned with the maintenance of laboratory atomic frequency standards have continuously sought improved apparatus and techniques for syntonizing the frequencies of laboratory standards with available external references.

SUMMARY OF THE INVENTION

It is, therefore, an object of the present invention to provide a frequency standard system to reduced cost and complexity which is capable of syntonization with an external frequency reference.

A further object of the present invention is to provide a more stable, longer-lived atomic frequency standard apparatus.

An additional object of the present invention is to provide an atomic frequency standard apparatus with improved accuracy.

Still a further object of the present invention is to provide an atomic frequency standard apparatus with reduced energy requirements.

Yet another object of the present invention is to provide a method for simple and rapid recalibration of atomic frequency standard sources without requiring the services of a calibration laboratory.

An additional object of the present invention is to provide a clock with increased accuracy.

To achieve the foregoing objects, the aforementioned C-field adjustment means is eliminated from the atomic frequency standard and a microcomputer-based adjustment means is added. Instead of adjusting the C-field of the atomic frequency standard, as is done in the prior art, error signals are generated which are a measure of the frequency difference between the external frequency reference and the atomic frequency standard. The error signals are stored in a microcomputer. The computer stores and accumulates various error signals. Periodically the computer issues a command which syntonizes the slave crystal oscillator of the atomic frequency standard with the external reference frequency. The atomic resonator is not adjusted.

BRIEF DESCRIPTION OF THE DRAWINGS

Further objects and advantages of the present invention will become apparent to those familiar with the art upon examination of the following detailed description and accompanying drawings in which.

DETAILED DESCRIPTION OF THE PREFERRED EMBODIMENTS

Figure 1:
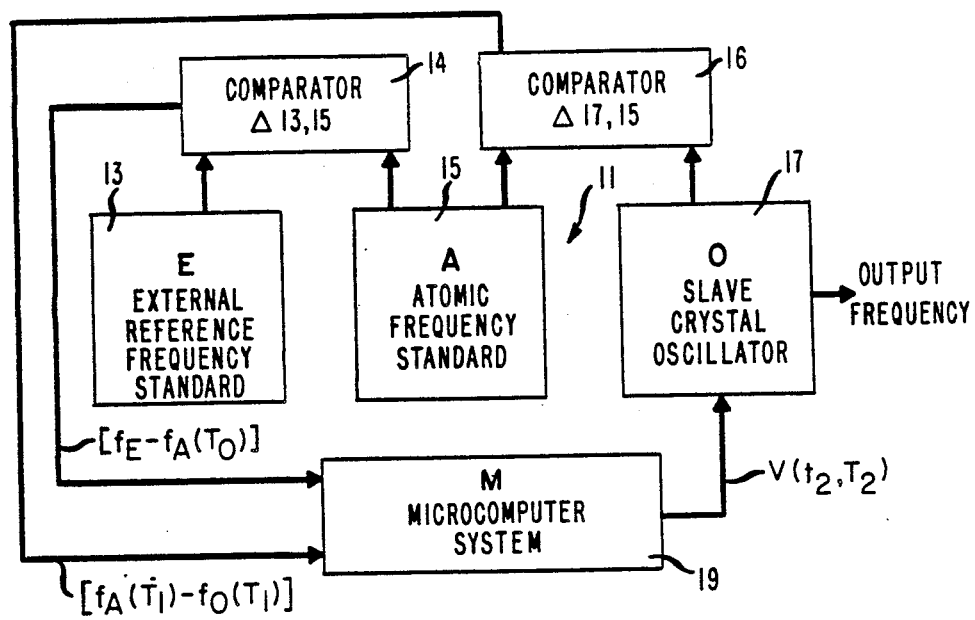
FIG. 1 is a block diagram of an atomic frequency standard based frequency source according to the present invention.

The present invention includes both an atomic frequency standard and an atomic frequency standard based clock. For simplicity, the atomic frequency standard, illustrated in FIG. 1, will be discussed first. In FIG. 1 reference numeral 13 designates generally an external reference frequency standard. The external reference standard 13 may be a portable cesium clock, a Loran-C receiver, or a Global Positioning System receiver. Reference numeral 11 designates generally the inventive device which includes an atomic frequency standard 15, a slave crystal oscillator 17, and a microcomputer system 19. The microcomputer system includes the circuitry for generating a voltage V(t, T) (to be explained later).

Atomic frequency standard 15 need not have a C-field adjustment means. Standard 15 may be any of the usual atomic standard types, such as a gas cell resonator, or a beam tube device, or a hydrogen maser. The operation of each of these atomic standards is well understood by those skilled in the art. In a preferred embodiment, for minimum cost, size and fastest warm-up, a rubidium gas cell resonator is preferred. The C-field of atomic standard 15 may be fixed at whatever value maximizes the standard's stability, i.e. minimize the standard's sensitivity to various influences. The slave crystal oscillator 17 is, in a preferred embodiment, an oven controlled, voltage controlled crystal oscillator. In addition, the frequency of the oscillator is adjustable by well-known electronic circuitry which is controllable by microcomputer 19.

In practice, the atomic frequency standard 15 may be kept on continuously, or may be operated in a duty cycling mode, especially in applications where power availability is limited, e.g. in battery operated equipment the duty cycling mode is preferred. Moreover, the atomic frequency standard may have an internal crystal oscillator in addition to the external slave crystal oscillator 17.

Microcomputer 19 stores certain data, performs calculations, and finally, issues commands to slave oscillator 17 which cause the control circuitry of slave oscillator 17 to adjust the oscillator's frequency to ultimately closely conform to the frequency of the external reference standard 13 in a manner to be described below. Alternatively, the frequency of the slave oscillator can be adjusted to some fixed multiple of the external reference frequeny. For example, if device 11 has an output frequency of 10 MHz, a 5 MHz external reference can be used provided that device 11 is capable of ×2 multiplication of the external reference frequency.

To understand the operation of device 11, it is important to keep in mind that both atomic oscillator 15 and slave crystal oscillator 17 are both somewhat temperature sensitive and time-dependent, i.e. the frequencies of both atomic standard 15 and crystal oscillator 17 change with variations in temperature and the passage of time. The inventive device operates by periodically comparing atomic standard 15 with external reference standard 13 in a comparator 14 and then periodically comparing slave crystal oscillator 17 with atomic standard 15 in a comparator 16. The deviations between the frequencies of atomic standard 15 and external reference 13 and also between slave crystal oscillator 17 and atomic standard 15 are fed into microcomputer 19 and are both noted and corrected, for the systematic effects such as temperature and aging in microcomputer 19. Then microcomputer 19 issues a command to the control circuitry of slave crystal oscillator 17 to adjust its frequency, thus bringing slave crystal oscillator 17 into syntonization with external frequency reference 13.

In order to simplify the discussion, the following symbology will be employed:

$f_E$ = frequency of the external frequency reference, $f_A(T_o)$ = frequency of the atomic resonator 15 at temperature $T_o$, where $T_o$ is the temperature during a comparison with the external frequency reference standard;

$f_A(T)$ = a function that describes the frequency vs. temperature characteristic of atomic resonator, 15;

$f_A(t)$ = a function that describes the frequency vs. time (i.e., aging) characteristic of atomic resonator, 15;

$f_o(T)$ = a function that describes the frequency vs. temperature characteristic of slave crystal oscillator, 17;

$f_o(t)$ = a function that describes the frequency vs. time (i.e., aging) characteristic of slave crystal oscillator, 17;

$\Delta f_o(V)$ = a function that describes the difference in frequency from a reference value vs. frequency control voltage characteristic of slave crystal oscillator, 17 (i.e., frequency shift of oscillator 17 as a function of control circuitry voltage).

Before the inventive device 11 is put into operation, it must be calibrated. Two calibration procedures are necessary. Both may be performed automatically. The first calibration procedure determines the temperature sensitivity of device 11, while the second calibration procedure determines the aging rate of device 11. In the first calibration procedure, the functions $f_A(T)$, $f_o(T)$ and $\Delta f_o(V)$ must be determined for the inventive device. In other words, the temperature dependence of the frequency of the atomic standard 15, the temperature dependence of the frequency of the crystal oscillator 17, and finally, the frequency shift of slave crystal oscillator 17 as a function of its control voltage must be determined in advance by calibration procedures easily accomplished by those skilled in the art. After calibration, it is therefore possible to predict the frequency shift caused by temperature variation in either atomic oscillator 15 or crystal oscillator 17. It is also necessary to be able to predict the frequency shift of crystal oscillator 17 due to changes in its control voltage.

As mentioned before, both atomic frequency standard 15 and slave crystal oscillator 17 incorporate precision temperature sensors. Periodically, e.g., once every six months, the frequency of atomic frequency standard 15 is compared to the frequency of the external frequency reference standard 13, and the frequency difference, $f_E - f_A(T_o)$, is stored in the microcomputer's memory 19. $T_o$ is, of course, the temperature of the atomic standard 15 at the time of comparison. Atomic frequency standard 15 is then compared with crystal oscillator 17 on a more frequent basis. For example, once a day atomic frequency standard 15 may be turned on for just long enough for it to stabilize. The frequency difference $f_A(T_1) - f_o(T_1)$ which represents a frequency comparison at temperature $T_1$ (which may be different than the temperature $T_o$ which prevailed when the first-mentioned frequency comparison between atomic frequency standard 15 and external reference 13 was made) is determined and is stored in the microcomputer memory. The microcomputer 19 is programmed to store the functions which represent the temperature dependence of both atomic frequency standard 15 and slave oscillator 17, (i.e. to obtain $f_A(T)$ and $f_o(T)$). The functions can be polynomials, for example.

Now, the second calibration step, namely determination of the aging rates of atomic frequency standard 15 and slave crystal oscillator 17 may be performed. For well behaved atomic standards and crystal oscillators, after many values of the two aforementioned frequency differences, namely $f_E - f_A(T_o)$ and $f_A(T_1) - f_o(T_1)$ are collected, the respective aging rates of atomic frequency standard 15 and crystal oscillator 17, namely $f_A(t)$ and $f_o(t)$ may be determined. For example, the aging rate $f_A(t)$ of atomic frequency standard 15 is determined by taking a series of monthly data points, $f_E - f_A(T)$, normalizing them to account for any temperature differences using the temperature dependence data established during the first part of the calibration procedure and then calculating the coefficients of the function $f_A(t)$. As more and more data is collected, the microcomputer can automatically adjust the coefficient in the function, as necessary. The task may be performed manually, or in a preferred embodiment, be accomplished by microcomputer 19. In fact, microcomputer 19 may be programmed to perform a curve fit of the data to a model, for example, a function of the type $y(t) = A \ Ln \ (Bt+1) + y(0)$. However, after an extended stabilization period, a linear approximation of the aging rate $f_A(t)$ should be sufficient for many applications. In the most demanding application, optimum minimum squared-error procedures for estimating the current state and forecasting future states may be used. When the device 11 is used as a clock driver, the time of the clock, its frequency and frequency drift are all included in the clock state as necessary to properly describe the behavior of the clock. Both ARIMA (Autoregressive Integrated Moving Average) models and Kalman filters may be used, and the microcumpter 19 is programmed to perform the necessary calculations.

Similarly, the aging rate $f_o(t)$ of slave crystal oscillator 17 may be easily determined in a similar manner, e.g., by simply performing a least square fit to the available data points (after the data has been corrected to account for any possible temperature variation and noise).

Thus, after the aforementioned two calibration steps, microcomputer 19 contains the aging rate and temperature dependence for both atomic frequency standard 15 and slave crystal oscillator 17. Furthermore, microcomputer 19 is programmed to calculate an optimum estimate of the aging rate functions $f_A(t)$ and $f_o(t)$. After the calibration steps have been performed and microcomputer 19 has calculated the temperature dependence and aging rate information and has furthermore been programmed to calculate the optimum estimate of the aging rate curves, inventive device 11 is ready for operation.

In operation, atomic frequency standard 15 is compared with external frequency reference standard 13 and then slave crystal oscillator 17 is compared with atomic frequency standard 15. Microcomputer 19 issues commands to the voltage control of crystal oscillator 17 based upon calculations utilizing the aforementioned stored and calculated data to bring crystal oscillator 17 into syntonization with (or with a fixed multiple of) the external frequency reference 13. Specifically, various frequency offsets due to temperature variation and aging are summed by microcomputer 19. Then microcomputer 19 calculates a voltage $V(t,T)$, and microcomputer controlled compensation circuitry generates a precise voltage $V(t,T)$ that is supplied to the voltage controlled crystal oscillator 17 such that the output frequency of crystal oscillator 17 equals the frequency (or a fixed multiple of the frequency) of external frequency reference 13. In other words, the sum of the offsets from the frequency (or fixed multiple of the frequency) of external frequency reference 13 due to all known causes is zero. The voltage $V(t,T)$ varies with both the time elapsed since the last frequency comparison and with the ambient temperature.

Expressed mathematically, the control voltage required at any particular time $t_2$ and temperature $T_2$, namely $V_2 = V(t_2, T_2)$ is calculated from the expression:

$$0 = f(V_2) + [f_E - f_A(T_o)] + [f_A(T_o) - f_A(T_1)] + \quad (1)$$
$$[f_A(T_1) - f_o(T_1)] + [f_o(T_1) - f_o(T_2)] +$$
$$[f_A(t_o) - f_A(t_1)] + [f_o(t_1) - f_o(t_2)]$$

where
$t_o < t_1 < t_2$ and
$t_o$ = time of comparison between atomic frequency standard 15 and external frequency reference standard 13 at ambient temperature $T_o$
$t_1$ = time of comparison between crystal oscillator 17 and atomic frequency standard 15 at ambient temperature $T_1$
$t_2$ = time at which syntonization between crystal oscillator 17 reference 13 is desired. Ambient temperature of inventive device is $T_2$.

Microcomputer 19 is programmed to calculate $\Delta f_o(V_2)$ from equation 1 and to provide commands to the slave oscillator voltage control circuitry so that voltage $V_2(t_2, T_2)$ is provided to crystal oscillator 17.

An examination of equation 1 reveals that the second through fifth terms, namely $[f_E - f_A(T_o)]$, $[f_A(T_o) - f_A(T_1)]$, $[f_A(T_1) - f_o(T_1)]$, and $[f_o(T_1) - f_o(T_2)]$, compensate for temperature induced frequency differences between external reference 13, atomic frequency source 15 and crystal oscillator 17. The term $[(f_E - f_A(T_o)]$ is simply a raw data item obtained from the last comparison between atomic reference standard 15 and external frequency reference standard 13. The last two terms are frequency difference terms which may be calculated by microcomputer 19 from the frequency-temperature curves stored in its memory as a result of the aforementioned calibration.

The last two terms of equation 1, namely:

$$[f_A(t_o) - f_A(t_1)] + [f_o(t_1) - f_o(t_2)]$$

provide correction for the effects of aging. The term $[f_A(t_o) - f_A(t_1)]$ is obtained by microcomputer 19 merely from the function that it has fit to atomic frequency standard 19's aging curve. The last term, namely $[f_o(t_1) - f_o(t_2)]$ is obtained by the computer from the function that it has fit to the crystal oscillator 17's aging curve.

Of course, other known system environmental sensors and corresponding frequency offsets (e.g., due to space radiation, shock and vibration) can be readily incorporated into the expression given by equation 1.

Moreover, the microcomputer compensation circuitry can include statistical testing and fault detection capabilities (e.g. to detect erratic aging). It should also be noted that implicit in equation 1 is the assumption that the temperature dependency of the aging rates and the time dependency of the temperature coefficients are negligible. Should these assumptions turn out to be incorrect for certain oscillators, then additional terms would need to be added to equation 1 in order to account for these effects.

The following example will illustrate some of the advantages projected from the use of the present invention: a typical prior art rubidium frequency standard with an adjustable C-field might be used in a temperature environment that varies between $-55°$ C. and $+68°$ C. A typical specification for this standard states that the temperature stability from $-55°$ C. to $+68°$ C. is $3 \times 10^{-10}$ and the aging is $6 \times 10^{-11}$ per month. If the standard is recalibrated by C-field adjustment every six months, the standard can be assumed accurate to a level no better than about $5 \times 10^{-10}$.

However, a well-behaved device according to the present invention might be reasonably be expected to exhibit an accuracy level of within $5 \times 10^{-11}$ for the same comparison period.

Figure 2:
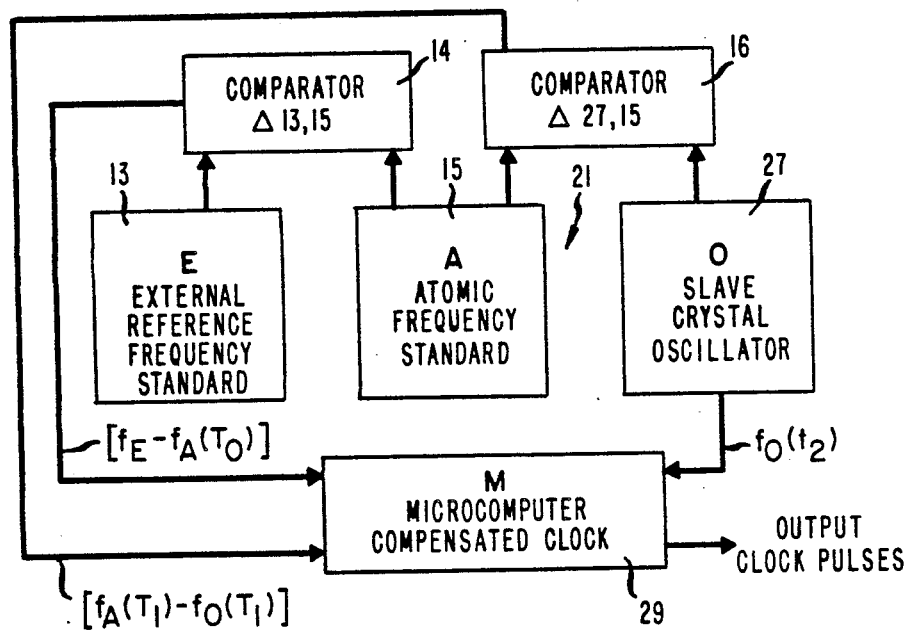
FIG. 2 is a block diagram of an atomic frequency standard based clock according to the present invention.

The inventive principles taught herein may also be used to make a highly accurate clock. Such a clock is illustrated in FIG. 2. In FIG. 2 external frequency reference source 13 and atomic frequency standard 15 are similar to or the same as their counterparts in FIG. 1. Slave crystal oscillator 27 is a low power oven controlled crystal oscillator or a low power temperature compensated crystal oscillator. Voltage control circuitry such as employed in FIG. 1 is not necessary for reasons that will beome apparent. Reference numeral 29 is a combination microcomputer compensated digital clock, equipped with pulse deletion circuitry which responds to microcomputer commands. The inventive device 21 comprising atomic frequency standard 15, slave crystal oscillator 27 and microcomputer compensated clock 29 is calibrated by the aforementioned two-step calibration procedure. The resulting frequency-temperature data and aging rates for atomic frequency standard 15 and crystal oscillator 27 are stored in the microcomputer portion of microcomputer clock 29 as before. Furthermore, microcomputer 29 is programmed to curve-fit the aging rate data and to perform the necessary aforementioned extrapolations (as before). In addition, microcomputer 29 is capable of performing the calculations described in connection with equation 1. In operation, the microcomputer calculates the offset of the slave crystal oscillator frequency from $f_E$ and the microcomputer compensated clock adjusts its clock output accordingly in order to provide an accurate clock output. Since it is usually easier to delete pulses than to add pulses, the slave crystal oscillator 27 frequency can be factory set so that its frequency remains slightly higher than the frequency of external reference 13 at all times. The microcomputer then periodically instructs its pulse deletion circuitry to skip the appropriate number of pulses necessary for keeping accurate time. An alternative to the use of pulse deletion circuitry is to use a programmable divider in order to derive the clock pulses from the crystal oscillator.

The illustrative embodiments herein are merely a few of those possible variations which will occur to those skilled in the art while using the inventive principles contained herein. Accordingly, numerous variations of invention are possible while staying within the spirit and scope of the invention as defined in the following claims and their legal equivalents.

What is claimed is:

1. A device comprising, in combination:
   an atomic frequency standard as a reference frequency source;
   a temperature compensated slave crystal oscillator having voltage-controlled frequency adjustment circuitry responsive to control by command signals from a microcomputer;
   a microcomputer in circuit with said atomic frequency standard and with said slave crystal oscillator, said microcomputer being programmed to command said adjustment circuitry to change the frequency of said slave crystal oscillator in accordance with periodic signals from said microcomputer developed in accordance with corresponding comparison signals produced by periodic comparisons of signals from said slave crystal oscillator and signals from said atomic frequency source; and
   said microcomputer contains temperature and aging data for both said atomic frequency standard and said crystal oscillator and said microcomputer is further programmed to command said voltage-controlled frequency adjustment circuitry to vary the frequency of said crystal oscillator to bring said crystal oscillator into syntonization with an external frequency source.

2. A device comprising, in combination:
   an atomic frequency standard;
   a temperature compensated crystal oscillator having pulse control circuitry responsive to pulse deletion signals from a microcomputer;
   a microcomputer compensated digital clock in circuit with said atomic frequency standard and with said crystal oscillator, said microcomputer compensated digital clock being programmed to send pulse deletion signals to said pulse control circuitry in accordance with periodic signals produced by comparisons of pulses from said crystal oscillator with pulses from said atomic frequency standard.

* * * * *